United States Patent [19]

Dougherty

[11] 4,369,154
[45] Jan. 18, 1983

[54] PROCESS FOR PRODUCING SMOOTHER CERAMIC SURFACES

[75] Inventor: William E. Dougherty, Poughkeepsie, N.Y.

[73] Assignee: International Business Machines Corp., Armonk, N.Y.

[21] Appl. No.: 203,776

[22] Filed: Nov. 3, 1980

[51] Int. Cl.³ .............................................. C04B 35/64
[52] U.S. Cl. ......................................... 264/63; 264/67
[58] Field of Search .............................. 264/56, 63, 67

[56] References Cited

U.S. PATENT DOCUMENTS

| | | | |
|---|---|---|---|
| 3,402,024 | 9/1968 | Marshall et al. | 264/56 |
| 3,538,600 | 11/1970 | Farrell et al. | 29/604 |
| 3,794,707 | 2/1974 | O'Neill et al. | 264/56 |
| 4,159,295 | 6/1979 | Mazzuchelli et al. | 264/63 |
| 4,193,082 | 3/1980 | Dougherty | 357/80 |
| 4,202,007 | 5/1980 | Dougherty et al. | 357/80 |

FOREIGN PATENT DOCUMENTS 753643  7/1956  United Kingdom .

Primary Examiner—Donald E. Czaja
Assistant Examiner—W. Thompson
Attorney, Agent, or Firm—Wesley DeBruin; John F. Ohlandt

[57] ABSTRACT

In a process for producing a ceramic substrate for use in an electrical packaging structure, according to which (1) a substantially homogeneous ceramic mass, comprising alumina or glass ceramic, an organic bonding agent, a plasticizing agent, an emulsifying agent, a glass frit, and a solvent, is formed into a cohesive flat strip, (2) said strip is green dried and cut into desired size substrates, and (3) said substrates are sintered, the improvement comprising the step of lapping the substrates prior to the sintering step, whereby, after sintering, a smoother surface is obtained on said substrates than is obtained with substrates that have not been so lapped.

5 Claims, 6 Drawing Figures

PART IA LAP [POST SINTER 140 X]

PART IB NO LAP [POST SINTER 140 X]

PART IC NO LAP [ PRE SINTER 140X ]

PART ID LAP [ PRE SINTER 140X ]

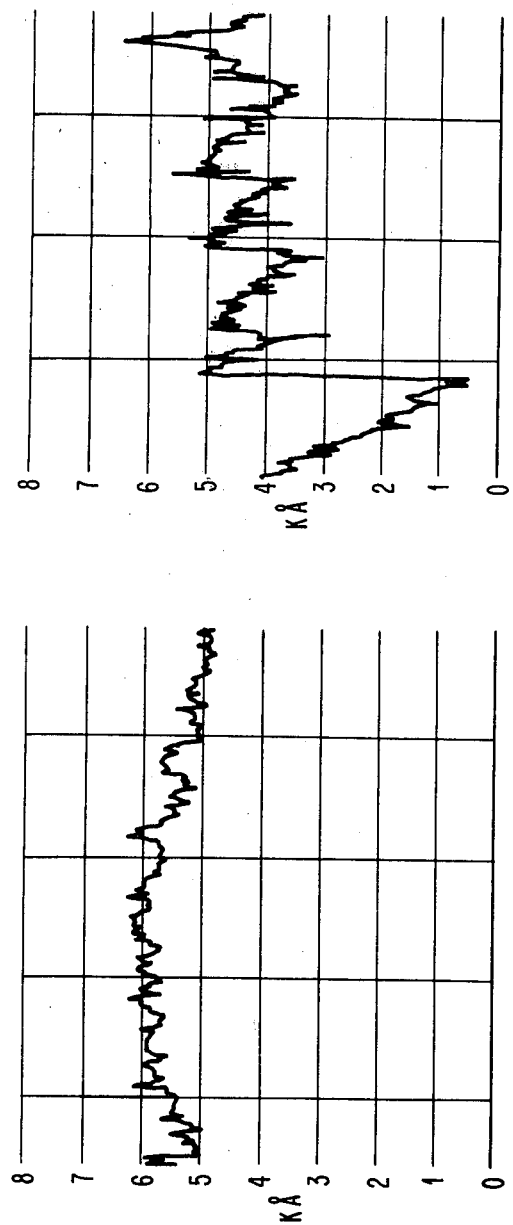

PROCESS FOR PRODUCING SMOOTHER CERAMIC SURFACES

BACKGROUND OF THE INVENTION

1. Field of the Invention

The present invention relates to semiconductor device packaging, and, more particularly, to a method or process for producing the ceramic substrates which serve as modules or carriers for integrated circuit devices. The surfaces of such substrates are capable of accepting thin layer conductive patterns so as to enable the connection to external inputs and outputs, as well as to internal layers, of densely organized integrated circuit chips.

2. Background Art

As integrated circuit technology has developed over the past several decades, certain materials have been preferred in the production of substrates for mounting or carrying the semiconductor chips in which complex, densely packed circuitry is embedded. In particular, because of their exceptional insulating properties, ceramics and glass ceramics have become the most preferred materials. However, in order to serve the purposes described, the substrates constituted of these materials are required to have a high degree of flatness; and also to possess a high quality surface, that is to say, the roughness of the surface must be in the range of 2,000 to 5,000 angstroms such that the required thin film conductors can be readily accommodated.

In order to provide background for the subject matter of the present invention, reference may be made to U.S. Pat. No. 4,159,295. That patent itself provides further background material, particularly with respect to a description of a number of techniques that have been adopted for producing ceramic substrates for use with thin film electronic circuits. The above noted patent also describes its invention as one involving a process for producing ceramic substrates according to which a substantially homogeneous extrudable ceramic mass, comprising a number of constituents in prescribed ranges, is vacuum extruded so as to achieve an endless relatively flat strip which is dried to a green state and, if the strip is to be used for thin layer circuits, is subjected to a plane parallel pressure of about 9,000 to 12,000 N/Cm$^2$, and then is fired or sintered into rigid ceramic substrates.

It has been discovered by the present inventors that significant improvement can be effected in the generalized context of ceramic substrate fabrication by lapping the ceramic substrates prior to the conventional sintering step, whereby a smoother surface is realized for said substrates than is normally obtainable at the completion of the sintering operation. By generalized context is meant a process of producing ceramic substrates regardless of whether extrusion, foil casting or other techniques are employed, or whether single or multiple layers of ceramic are involved in their fabrication.

It is therefore a primary object of the present invention to provide an improved process for achieving ceramic substrates for integrated circuit packaging.

A further object is to reduce significantly the time taken for the processing of such substrates by eliminating or minimizing the conventional post-sintering lapping and grinding procedures.

Yet another object is to perform a lapping operation on the substrates at a stage in the process, that is, in the green state-before sintering-where warp and camber have been caused by the stresses introduced by the prior pressing or lamination stage.

SUMMARY OF THE INVENTION

The invention provides an improved process or method according to which (1) a substantially homogeneous ceramic mass, comprising alumina or glass ceramic, an organic bonding agent, a plasticizing agent, an emulsifying agent, a glass frit and a solvent, is formed into a cohesive flat strip, (2) said strip is green dried and cut into desired size substrates, and (3) said substrates are sintered, the improvement being that a step of lapping the substrates prior to the sintering step is performed.

The unusual result of the present invention is achieved despite the fact that the ceramic substrates which are lapped appear, prior to sintering, to have as rough surfaces as, or rougher surfaces than, the unlapped substrates possess. Accordingly, it would not be expected in the normal course, that is, after the sintering step, that the lapped substrates would turn out much smoother and flatter than the unlapped. The explanation for this phenomenon is believed to be that the pre-sintered lapping removes from the outer surfaces of the substrate the excess binder that has migrated to the surface during the previous stage of processing. Thus, in the practice of the conventional technique according to which no lapping is provided, the binder-rich surfaces fires off during the sintering operation, leaving voids in its place which results in a rougher surface finish. It is also believed that the pre-sintered lapping in accordance with the present invention also preferentially removes the larger grains of alumina. The voids created are filled with any of the smaller grains which are disturbed during the lapping operation. Thereby, after sintering, a smoother surface finish results. It should further be noted that the lapping also removes any camber and warp generated during previous stages of processing, that is, during pressing or lamination.

The improved method of the present invention can be implemented by simply placing the surface to be lapped down on No. 600 grit sandpaper and then lapping in a circular or figure-8 movement. Of course, such a technique would be altered for production line purposes. Nevertheless, despite its simplicity, it does produce the results which will be explained further hereinafter.

On the other hand, when ceramic substrates have been subjected to a grinding or lapping operation only after they have been sintered—in accordance with standard practice—the warp and camber incurred during sintering dictates that a large amount of grinding or lapping be carried out to get a sufficiently smooth surface.

Other and further objects, advantages and features of the present invention will be understood by reference to the following specification in conjunction with the annexed drawing, wherein like parts have been given like numbers.

DESCRIPTION OF THE DRAWING

FIGS. 2A and 2B are graphs resulting from measurements taken of the surfaces of ceramic substrate samples.

DESCRIPTION OF PREFERRED EMBODIMENT

The preferred embodiment of the present invention is carried out in the generalized context of the production of ceramic substrates as heretofore described. In particular, the process includes the formation of a homogeneous ceramic mass comprising about 85 to 99 percentage by weight of alumina; about 2 to 10 percentage by weight of an organic bonding agent such as polyvinyl butyral; about 1 to 5 percentage by weight of a plasticizing agent.

It will be appreciated that the above ranges are provided simply to give some notion of the general process context in which the present invention is operative, and that it is not necessary or critical for these ranges to obtain in order to realize the results achievable by the present invention.

As one particular example of conventional techniques a flat strip formed by conventional casting techniques is green dried for approximately fifteen minutes at a temperature of 75° C. Multiple strips are then laminated together to produce a ceramic body.

In order to test the effectiveness of the technique of the present invention, several samples were obtained from a 90 mm$^2$ ceramic body so produced, and these samples were lapped on both sides with 240 grit sandpaper for several minutes, then with 600 grit sandpaper for several minutes, depending on camber, which step can be followed by a finishing step with a buffing wheel. The samples denominated IA and IB are shown respectively in FIGS. 1A and 1B. These samples were fired or sintered in the conventional manner, as by using a temperature in the range of 1,000° to 2,000° C. for a period of time ranging between 1 to 5 hours.

Figure 1A:
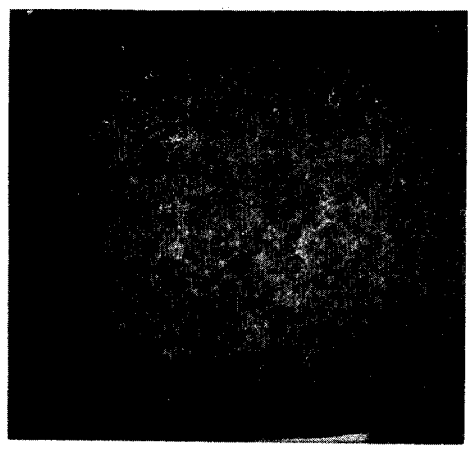
FIGS. 1A and 1B are reproductions of photomicrographs of two samples of ceramic substrates cut from a single processed ceramic body.
Figure 1B:
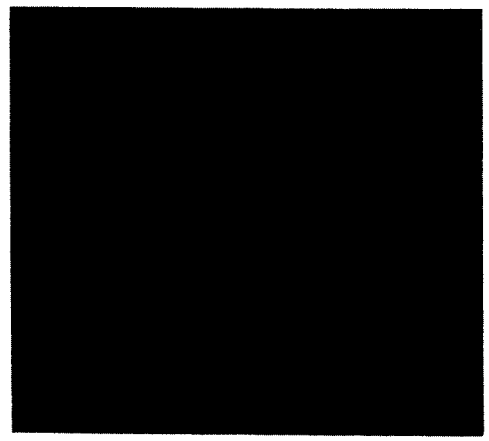
Figure 1C:
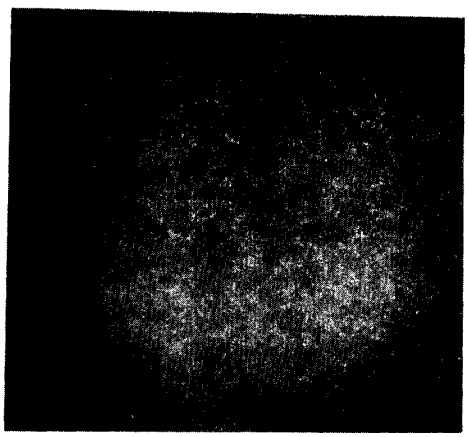
FIGS. 1C and 1D are similar photomicrographs of another two samples from the same ceramic body.
Figure 1D:

The sample shown in the reproduced photomicrograph of FIG. 1A, that is sample IA, was lapped prior to sintering in accordance with the technique of the present invention whereas sample IB shown in FIG. 1B was not so lapped. After sintering of these samples it will clearly be seen that the sample that had been lapped has a surface which is much more reflective, hence, smoother, than the unlapped. However, as will be seen by reference to FIGS. 1C and 1D in which two other samples were also photographed, but this time prior to sintering, the sample that was not lapped, namely that in FIG. 1C, has about the same degree of smoothness as, or is smoother than, the lapped sample shown in FIG. 1D.

Referring now to FIGS. 2A and 2B, these are graphs resulting from measurements taken of the fired surfaces of samples IA and IB (previously illustrated in FIGS. 1A and 1B respectively, typically by using a stylus-probe surface measuring device. As indicated on the figures, sample IA is a sample that was lapped before firing or sintering. It should be noted that the scale for this plot is 10K angstroms per large box on the ordinate; likewise, for the scale of FIG. 2B. In the case of FIG. 2A, the surface roughness for sample IA shows a maximum peak-to-valley of 5K angstroms with an average value of 3K angstroms. However, in the case of FIG. 2B, which provides the measurements of surface roughness for sample IB, the maximum peak-to-valley is 12K angstroms, the average being 4K angstroms.

What has been disclosed is a technique for significantly improving the processing of ceramic substrates adapted to carry integrated circuit semiconductor chips. The technique comprises the step of lapping the ceramic substrates prior to the sintering operation whereby the substrates can be completely processed in a shorter time because conventional post-sintering lapping and grinding procedures can be eliminated or at least minimized.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. In a process for producing ceramic substrates for use in an electrical packaging structure, according to which (1) a substantially homogeneous ceramic mass comprising alumina, an organic bonding agent, a plasticizing agent, an emulsifying agent and a solvent is formed into a cohesive flat strip, (2) said strip is green dried and cut into desired size substrates, and (3) said substrates are sintered, the improvement comprising the step of lapping the substrates prior to the sintering step, whereby, after sintering, a smoother surface is obtained on said substrates than is obtained with substrates that have not been so lapped.

2. In a process as defined in claim 1, in which (2) is carried out at a temperature of 75° C. for approximately fifteen minutes.

3. In a process as defined in claim 1, in which step (3) is carried out at a temperature of 1000° to 2000° C. for a period of approximately one to five hours.

4. In a process as defined in claim 1, in which the alumina is approximately 85 to 99% by weight of the total ceramic mass, the organic bonding agent is 2 to 10% by weight, and the plasticizing agent is 1 to 5% by weight.

5. In a process as defined in claim 4, in which said organic bonding agent is poly-vinyl butyral.

* * * * *